United States Patent
Kyomasu et al.

(10) Patent No.: US 6,766,936 B2
(45) Date of Patent: Jul. 27, 2004

(54) TRANSDUCER AND A BONDING APPARATUS USING THE SAME

(75) Inventors: Ryuichi Kyomasu, Kodaira (JP); Osamu Kakutani, Oume (JP); Yoshihiko Seino, Musashimurayama (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

(21) Appl. No.: 10/234,777

(22) Filed: Sep. 4, 2002

(65) Prior Publication Data

US 2003/0047583 A1 Mar. 13, 2003

Related U.S. Application Data

(63) Continuation-in-part of application No. 10/185,583, filed on Jun. 28, 2002.

(30) Foreign Application Priority Data

Sep. 7, 2001 (JP) .................................. 2001-272001

(51) Int. Cl.⁷ .............................. B23K 5/20; B23K 37/00
(52) U.S. Cl. ....................... 228/1.1; 228/4.5; 228/180.5
(58) Field of Search ....................... 228/4.5, 1.1, 180.5; 219/56.1, 56.21; 310/321, 323.18, 323.19, 328

(56) References Cited

U.S. PATENT DOCUMENTS

| 5,469,011 A | * | 11/1995 | Safabakhsh ................. 310/325 |
| 5,595,328 A | * | 1/1997 | Safabakhsh et al. ......... 228/1.1 |
| 6,189,761 B1 | * | 2/2001 | Kyomasu .................... 228/1.1 |
| 2002/0056906 A1 | * | 5/2002 | Kajiwara et al. ........... 257/697 |
| 2003/0000994 A1 | * | 1/2003 | Kyomasu et al. ............ 228/1.1 |
| 2003/0168938 A1 | * | 9/2003 | Wallaschek et al. ........ 310/328 |

FOREIGN PATENT DOCUMENTS

| JP | H5-347334 | 12/1993 |
| JP | H6-196532 | 7/1994 |
| JP | H10-303240 | 11/1998 |
| JP | 2001-024025 | 1/2001 |

* cited by examiner

Primary Examiner—L. Edmondson
(74) Attorney, Agent, or Firm—Koda & Androlia

(57) ABSTRACT

A transducer vibrated by a vibrator and used in a bonding apparatus, the transducer including holding portions and connecting portions. The holding portions are provided so as to protrude at at least two locations that correspond to the nodes of vibration of a transducer main body, and the connecting portions each connects the tip ends of two protruding holding portions to each other. The external force applied to one of the holding portions is thus dispersed in each of the respective holding portions connected by the connecting portions, deformation of the holding portions is prevented, and the respective holding portions can be formed extremely thin in the axial direction of the transducer main body.

4 Claims, 10 Drawing Sheets

PIROR ART

PIROR ART

TRANSDUCER AND A BONDING APPARATUS USING THE SAME

BACKGROUND OF THE INVENTION

1. Field of the Invention

The present invention relates to a transducer which is used in a bonding apparatus and to a bonding apparatus which is structured to include the transducer.

2. Prior Art

In a bonding apparatus including wire bonding apparatuses, a transducer such as an ultrasonic horn and the like is used. Bonding is accomplished by applying a load and ultrasonic vibrations to the bonding section of the horn by causing the transducer to vibrate in the lengthwise direction (axial direction) of the transducer by a vibrator and at the same time by lowering a bonding tool mounted at the tip end of the transducer toward the object of process (bonding) and applying a load thereto.

A conventional supporting structure for such a transducer used in a wire bonding apparatus (not shown) is shown in FIG. 10.

In this transducer, a capillary 166 used as a bonding tool. The capillary 166 is attached to the tip end of an ultrasonic horn 151 that is used as a transducer, and a wire (not shown) passes through the capillary 166. An ultrasonic vibrator 90 is fastened to the base end of the ultrasonic horn 151. A flange 154 which has a cylindrical shape and is connected to the ultrasonic horn 151 at the front end of said flange 154 is disposed on the ultrasonic horn 151. The flange 154 is provided so that it is at a node (i.e., a point where the strain reaches the maximum) position of the ultrasonic vibration, which is applied as a compressional wave (longitudinal wave) in the axial direction, i.e., the direction of length of the horn 151. The flange 154 is connected to a cylindrical horn support 155. The horn support 155 is fastened to a transducer holder 156, and this transducer holder 156 is fastened to a supporting shaft 157. The supporting shaft 157 is supported on a bonding head (not shown) of the bonding apparatus either directly or via a lifter arm, so that the supporting shaft 157 is free to rotate.

Wire bonding apparatuses of this type are disclosed in, for example, Japanese Patent Application Laid-Open (Kokai) Nos. 5-347334, 6-196532 and 10-303240.

In the above prior art, the flange 154 is disposed at a node position of the ultrasonic vibration in the ultrasonic horn 151. Accordingly, the energy loss (so-called leakage) via this flange 154 is small; and thus, a defective crushed shape of the ball, stripping of the ball or damage to the substrate, etc., caused by the continued application of unnecessary ultrasonic energy following the completion of bonding can be prevented.

However, as the operation of the bonding apparatus is performed at higher speeds, oscillation during the raising and lowering movement of the transducer becomes a problem. In this respect, since the ultrasonic horn 151 in the above prior art is supported at only one place, it is difficult to effectively suppress the oscillation of the transducer caused by the operation of the bonding head. When such oscillation occurs, an excessive force is applied to the ball during bonding, and defects in the crushed shape of the ball occur. This problem is especially conspicuous in the diameters of press-bonded balls that have been reduced as a result of the increasingly finer pitch of recent semiconductor devices.

In order to deal with oscillation of the transducer during the raising and lowering movement of the transducer, the applicant of the present invention has proposed in Japanese Patent Application Laid-Open (Kokai) No. 2001-24025 a transducer structure as shown in FIG. 11.

In this structure, an ultrasonic horn 201 used as a transducer is attached to a transducer holder 206 via two horn supporting members 205 that are separate elements from the ultrasonic horn 201. The attachment positions of the horn supporting members 205 in the axial direction of the ultrasonic horn 201 are adjustable. In this structure, since there are two supporting points, oscillation during the raising and lowering movement of the ultrasonic horn 201 can be effectively prevented. Furthermore, a loss of the ultrasonic vibration (compressional wave) in the axial direction of the horn can also be prevented by causing the attachment positions of the horn supporting members 205 with respect to the ultrasonic horn 201 to coincide with node positions of the vibration of the ultrasonic horn 201.

Incidentally, as the regions where the horn supporting members (horn supporting members 205 in the structure of FIG. 11) are connected to the ultrasonic horn become larger (thicker) in the direction of length of the ultrasonic horn, the portions of these regions that are away from the nodes of the vibration increase. As a result, there is a corresponding increase in the energy loss. More specifically, in order to reduce the energy loss that occurs via the horn supporting members, it is desirable to form the horn supporting members as thin as possible in the axial direction of the ultrasonic horn. However, if the horn supporting members are thin, then there is a corresponding drop in the strength of the horn supporting members.

Furthermore, in the structure in which the ultrasonic horn 151 is supported at a single point as shown in FIG. 10, the cutting work for forming the cylindrical flange 154 into a cylindrical shape that is open at one end is difficult, and it is also difficult to reduce the size of the ultrasonic horn 151. Moreover, in the structure that uses two horn supporting members 205 that are independent elements from the ultrasonic horn 201 as shown in FIG. 11, the total number of parts increases, and assembly becomes bothersome.

SUMMARY OF THE INVENTION

Accordingly, the object of the present invention is to provide a transducer having a structure that provides the supporting members of the transducer with strength and that makes it possible to form such supporting members as thin as possible in the axial direction of the transducer.

The above object is accomplished by a unique structure for a transducer which is caused to vibrate by an operation of a vibrator, and the transducer of the present invention comprises: holding portions which are provided in at least two areas that include nodes (or node positions) of vibration in a transducer main body, and connecting portions that connect the holding portions to each other at areas that differ from areas where the holding portions protrude from the transducer main body; and further the transducer main body, the holding portions and the connecting portions are integrally formed from a single material member, and a tool that performs a treatment action such as bonding is located at a vibration crest, and such a tool can be disposed outside the region that is located between at least two holding portions or inside the region that is located between at least two holding portions.

In the structure of the above-described transducer of the present invention, the holding portions are disposed in at least two areas that include nodes of vibration in the transducer main body. Accordingly, oscillation of the transducer is prevented without causing a vibrational energy loss in the axial direction of the transducer. Furthermore, in the transducer of the present invention, the connecting portions that connect the holding portions to each other are provided at areas that differ from areas where the holding portions protrude from the transducer main body. Accordingly, the external force applied to one of the holding portions is dispersed in each of the respective holding portions connected by the connecting portions, deformation of the holding portions is prevented, and the respective holding portions can be formed extremely thin in the axial direction of the transducer main body.

Furthermore, since the transducer main body, holding portions and connecting portions are formed integrally from the same member, a sufficient strength is secured at the connection areas between the holding portions and the transducer main body, and the holding portions can be made even thinner.

In addition, when the tool that performs the treatment action is disposed inside the region that is located between the two holding portions, it is preferable that such holding portions are installed in two places, and a chip suction-chucking port is installed at an intermediate point between the points where these holding portions are provided. With this structure, the load distribution on the chip suction-sucking port can become evened.

When the above-described transducer is used in a bonding apparatus, the advantages and effect described above with reference to the transducer are obtained.

DETAILED DESCRIPTION OF THE INVENTION

Embodiments of the present invention will be described below with reference to the accompanying drawings.

Figure 1:
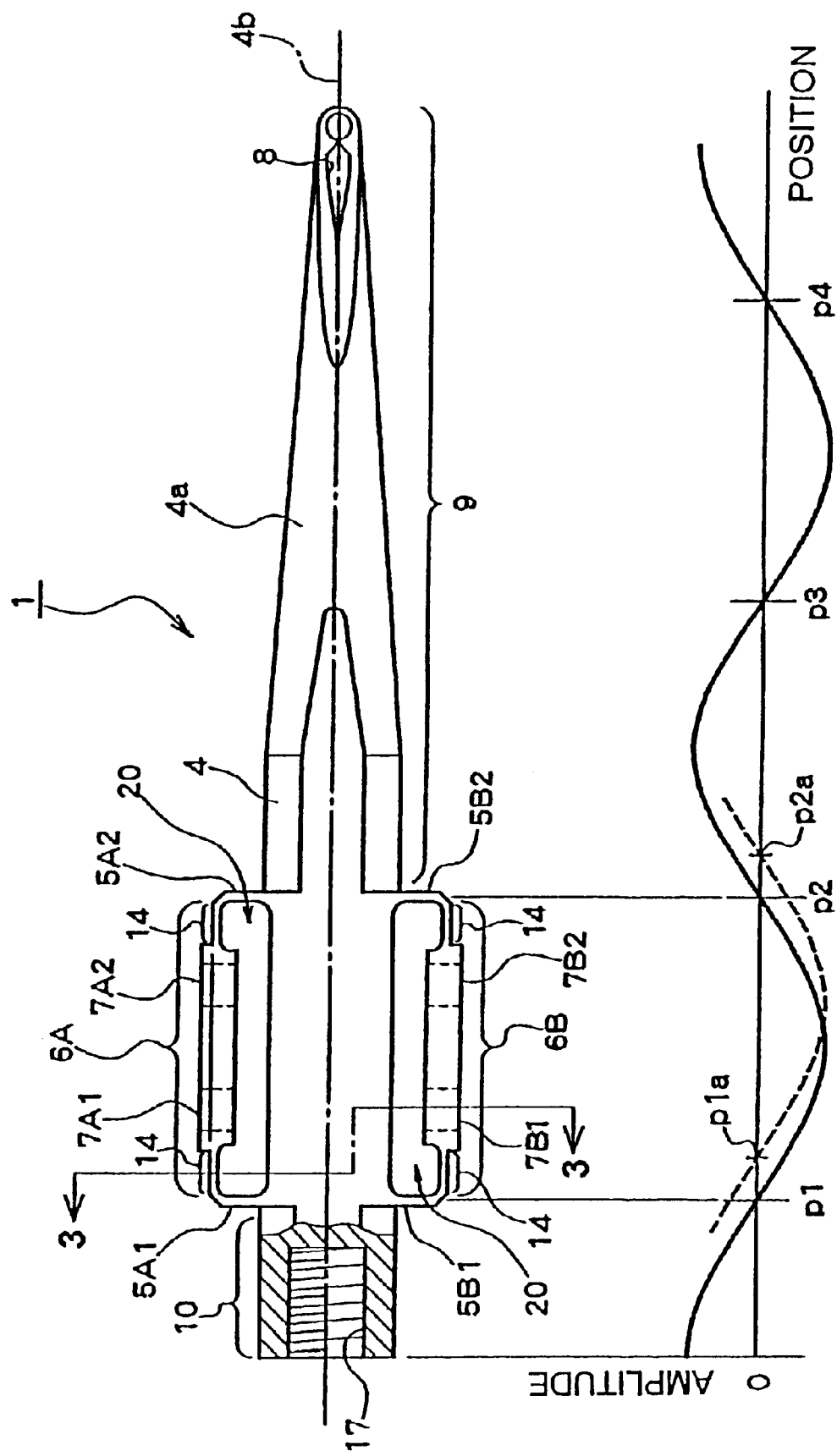
FIG. 1 is a top view of the transducer used as a bonding horn according to the first embodiment the present invention, a graph indicating the positions of the nodes of vibration being shown with reference to the transducer.
Figure 2:
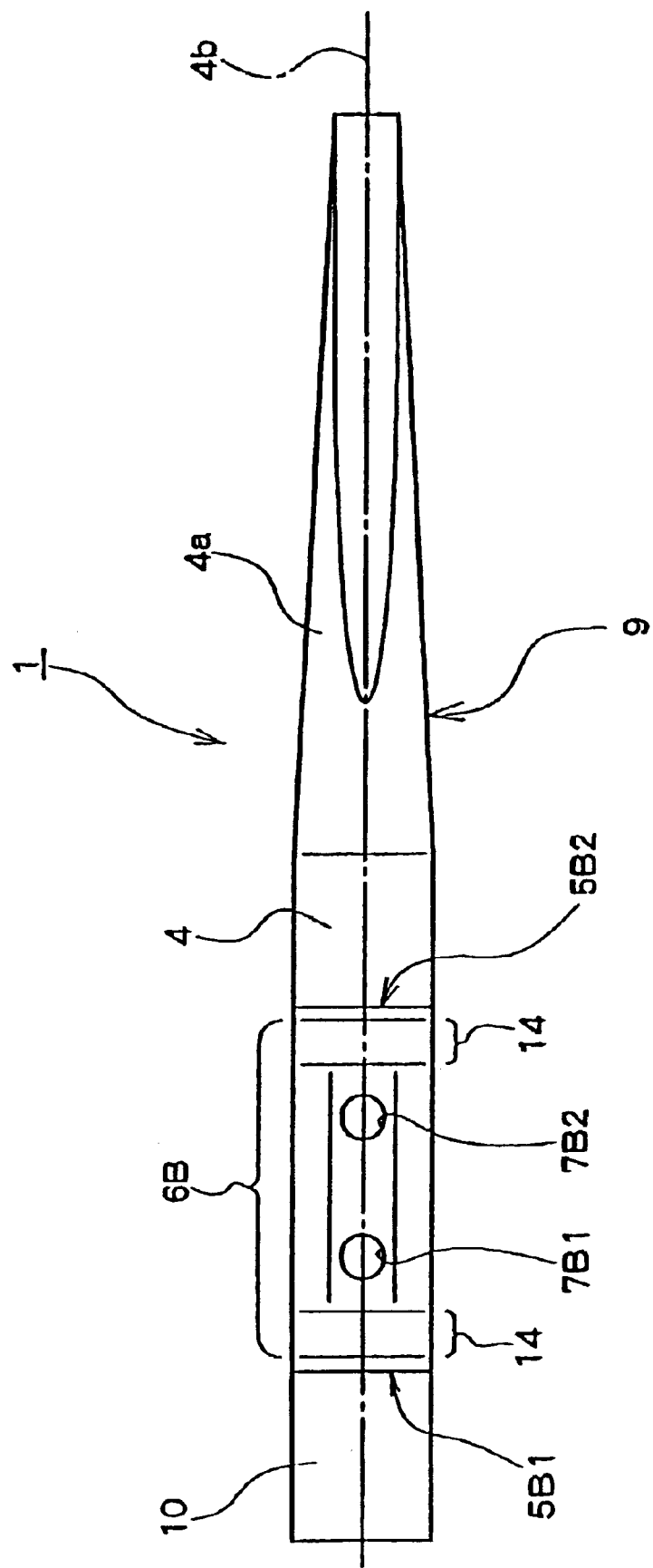
FIG. 2 is a side view thereof.

The ultrasonic horn 1 used as a transducer of the present invention is, as seen from FIG. 1, comprised of: a substantially cylindrical horn main body (or a transducer main body) 4, holding portions 5A1, 5A2, 5B1 and 5B2 (collectively referred to as "holding portions 5"), and connecting portions 6A and 6B (collectively referred to as "connecting portions 6"), which are integrally formed from the same or single material member.

The horn main body 4 has a cone portion 4a formed on the front-side (or at the tip-end). The holding portions 5 (5A1, 5A2, 5B1 and 5B2) are disposed in two areas each on the left and right sides (for a total of four areas) on the horn main body 4. In other words, the holding portions 5A1 and 5A2 are on one side of the horn main body 4, and the holding portions 5B1 and 5B2 are on another side of the horn main body 4. The connecting portions 6 (6A and 6B) connect the side ends of two (front and rear) holding portions 5 to each other. In other words, the connecting portion 6A connects the end portions of the holding portions 5A1 and 5A2 that protrude sideways from the horn main body 4; and the connecting portion 6B connects the end portions of the holding portions 5B1 and 5B2 that protrude sideways from the horn main body 4.

Figure 5:
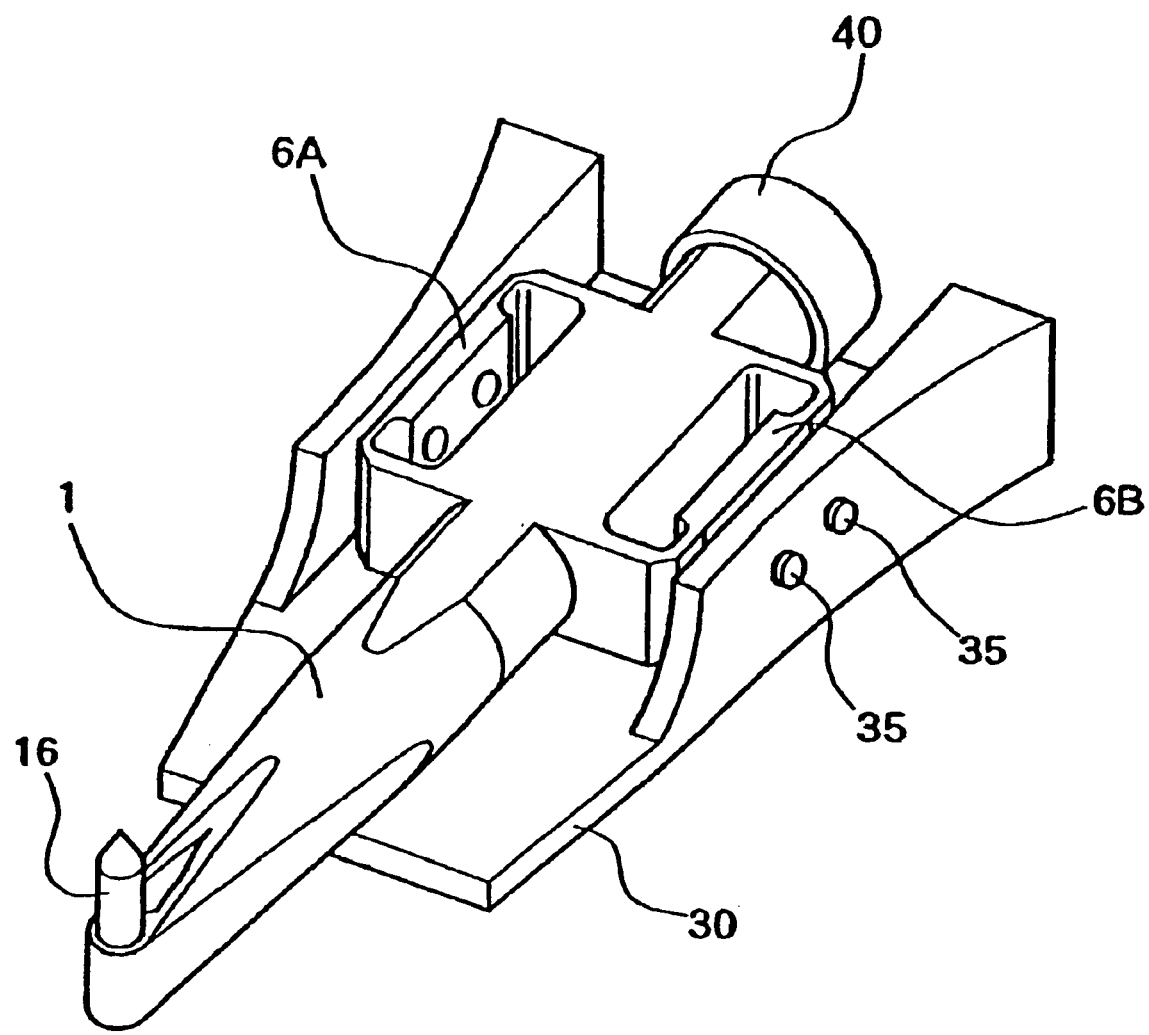
FIG. 5 is a schematic perspective view of the under side of the transducer mounted to a transducer holder.

The ultrasonic horn 1 further has a screw hole 17 on the rear-side (or at the base-end). To this screw hole 17, an ultrasonic vibrator 40 (see FIG. 5) that generates an ultrasonic vibration is fastened.

The shape of the cone portion 4a is a known conical shape. A mounting hole 8 for mounting a capillary 16 (see FIG. 5) is bored at the tip end of the cone portion 4a.

Figure 4:
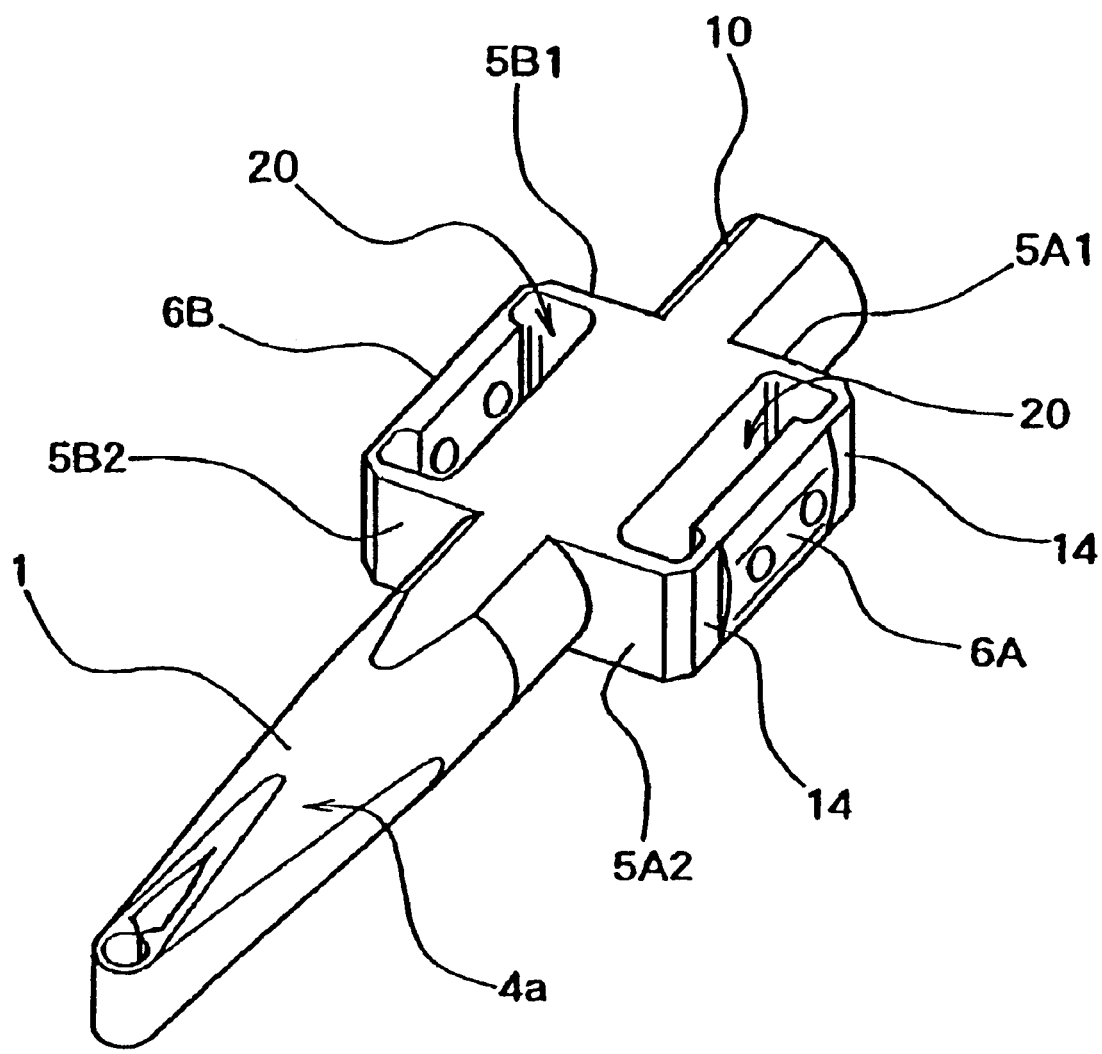
FIG. 4 is a schematic perspective view of the transducer.

The holding portions 5 are all flat-plate-form elements as seen from FIGS. 1 and 4 when viewed from above. Of the four holding portions 5, the holding portions 5A1 and 5B1 on the rear side of the horn main body 4 are disposed at a position of the first node p1 from the base end of the horn main body 4, and the holding portions 5A2 and 5B2 on the front side of the horn main body 4 are disposed at a position of the second node p2 from the base end of the horn main body 4.

The mounting hole 8 is, as seen from FIG. 1, provided outside the area that is surrounded by the holding portions 5 (5A1, 5A2, 5B1 and 5B2). Also, the mounting hole 8 is disposed so that the axis of the capillary 16 mounted therein coincides with the vibration crest (an area where the absolute value of the velocity is a maximum value).

The holding portions 5 are designed so that their intermediate points in the direction of thickness (in the left and right directions in FIG. 1) accurately coincide respectively with the nodes p1 and p2 of vibration in the design of the ultrasonic horn 1. However, since there is a certain variation in the actual positions of the nodes of vibration of the ultrasonic horn 1 depending upon the manufacturing precision of the ultrasonic horn 1, the actual positions of the nodes of vibration may differ from the designed positions in some cases. The thickness of the respective holding portions 5 is approximately 0.5 mm.

Screw holes 7A1, 7A2, 7B1 and 7B2 (collectively referred to as "screw holes 7") that constitute fastening means used for fastening the connecting portions 6A and 6B of the ultrasonic horn 1 to a transducer holder 30 (see FIGS. 3 and 5) are formed in the connecting portions 6A and 6B.

The screw holes 7 are respectively formed at two points located at different positions in the direction of the length (in the left and right directions in FIG. 1) of the connecting portions 6A and 6B.

Respective flat-plate-form thin portions 14 are formed in the front and rear portions of the connecting portions 6A and 6B. The thickness of these thin portions 14 is approximately 0.5 mm.

The respective holding portions 5A1, 5A2, 5B1 and 5B2 have equal lengths (i.e., equal lengths in the top-bottom direction in FIG. 1). The lengths of the connecting portions 6A and 6B are likewise equal to each other (i.e., equal in the left-right direction in FIG. 1).

Moreover, the screw holes 7A1 and 7A2 are disposed so that these screw holes are symmetrical with respect to each other. In other words, the screw holes 7A1 and 7A2 are disposed at positions that are located at equal distances from the front and rear ends of the connecting portions 6. The same applies to the screw holes 7B1 and 7B2. Accordingly, the screw holes 7A1 and 7A2, and the screw holes 7B1 and 7B2, are disposed in positions that are equal to each other in terms of a path-length of the vibration transmission paths that are formed (or represented) by the holding portions 5 and connecting portions 6.

Figure 3:
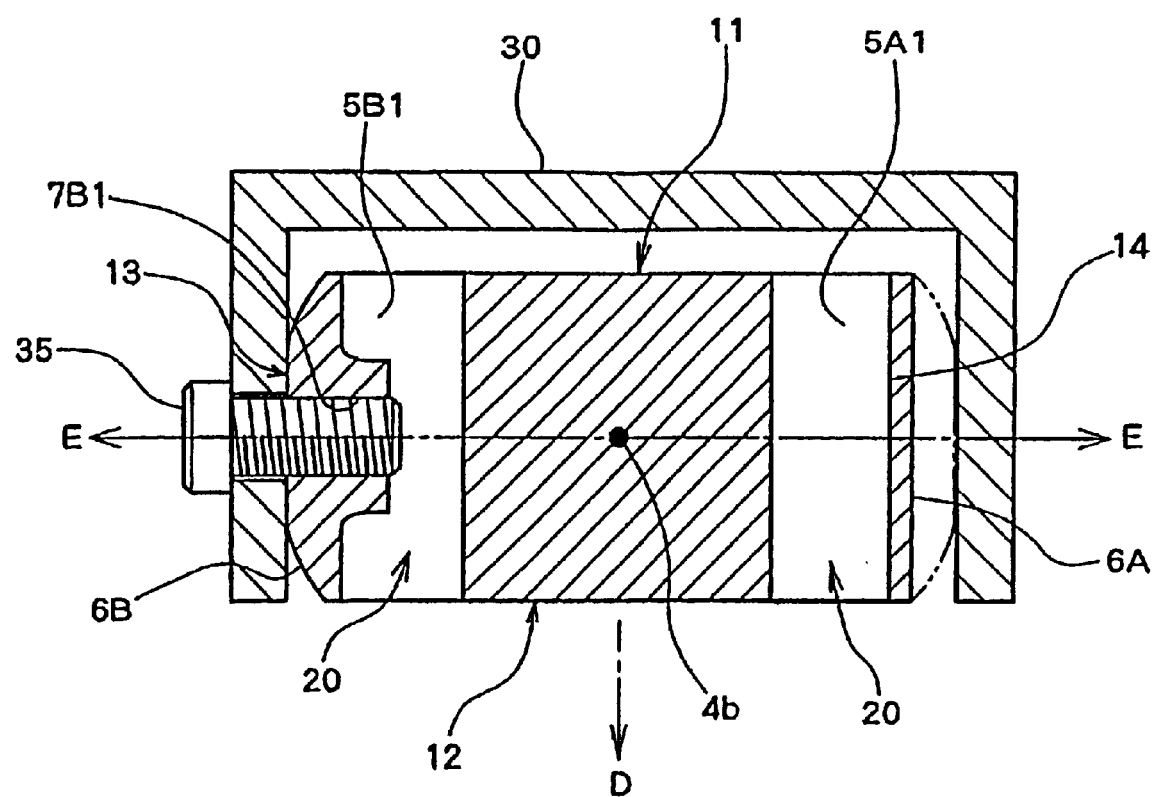
FIG. 3 is an enlarged sectional view of the transducer mounted to a transducer holder, the transducer being taken along the line 3—3 in FIG. 1.

As shown in FIGS. 1 and 3, the holding portions 5A1 and 5A2 and connecting portion 6A, and the holding portions 5B1 and 5B2 and connecting portion 6B, are disposed on both sides of the axial center 4b of the horn main body 4 so that these elements are symmetrical with respect to the axial center 4b.

Furthermore, the holding portions 5A1 and 5A2 and connecting portion 6A, and the holding portions 5B1 and 5B2 and connecting portion 6B, are formed so as to project in the horizontal direction (or in a direction of E—E in FIG. 3 or in a top-bottom direction in FIG. 1) that crosses (at right angles) the vertical downward direction (the direction D in FIG. 3) that is the direction of operation of the ultrasonic horn 1. In other words, the holding portions 5 are formed so as to project sideways from the ultrasonic horn (transducer main body) 1, and the connecting portions 6 connect the tip end areas of the holding portions 5, such tip end areas being different (or opposite) from the areas where the holding portions 5 project from the ultrasonic horn (transducer main body) 1.

The ultrasonic horn 1 is manufactured in the following manner:

First, a mounting hole 8 for mounting a capillary 16 (see FIG. 5) therein is bored by means of a broaching mill in the front-side portion of a round bar material that constitutes the matrix material. In addition, the screw hole 17 is bored in the base end (or the rear-side portion) of the round bar material.

Next, the front side and rear side of the round bar material are cut in toward the axial center 4b by means of a lathe, thus forming a front-side portion 9 and a rear-side portion 10.

Next, a top plane 11, bottom plane 12 and side planes 13 (see FIG. 3) are respectively formed by means of a milling machine, and also the outside surfaces of the thin portions 14 are formed. Furthermore, screw holes 7 (7A1, 7A2, 7B1 and 7B2) are formed by means of an end mill and tap.

Then, through-holes 20 are formed in the vertical direction on both sides of the axial center 4b by an end mill. The shape of the through-holes 20 in a top view is invariable (consistent) with respect to the vertical direction. As a result of the boring of the through-holes 20, the horn main body 4, holding portions 5 and connecting portions 6 are integrally formed around the through-holes 20 from the same or a single matrix material member; and as a result, empty spaces defined by the through holes 20 surrounded by the horn main body 4, holding portions 5 and connecting portions 6 are provided on both sides of the horn main body 4.

The ultrasonic horn 1 thus manufactured is fastened to a horn or transducer holder 30 (see FIGS. 3 and 5), which is C-shaped in cross-section and open at the bottom, by way of screwing bolts 35 into the respective screw holes 7A1 through 7B2. As a result, the ultrasonic horn 1 is fastened to the transducer holder 30 at four points on a horizontal plane indicated by the line E—E in FIG. 3. At an appropriate area on the end surface of the base portion of the transducer holder 30, the transducer holder 30 is fastened to the bonding head driving mechanism of a wire bonder main body (not shown).

The bonding head driving mechanism moves the ultrasonic horn 1 to any desired position on the horizontal plane and also applies a desired downward-oriented load to the ultrasonic horn 1. Meanwhile, a known ultrasonic vibrator 40 formed by stacking magnetostriction elements in the axial direction is fastened in place in the screw hole 17 that is formed in the base end of the horn main body 4. A capillary 16 is set in the mounting hole 8.

In the above structure, the ultrasonic vibration generated by the ultrasonic vibrator 40 is transmitted from the base end toward the tip end of the ultrasonic horn 1 in the direction of length, i.e., along the axial center 4b, as a compressional wave (longitudinal wave).

In the above-described embodiment, the holding portions 5 are provided in two areas that include the nodes p1 and p2 of vibration in the horn main body 4. Accordingly, since these nodes are at points where no vibration occurs, there is no loss of the vibrational energy of the compressional wave (longitudinal wave) along the axial center 4, and oscillation of the ultrasonic horn 1 is prevented. In addition, since the connecting portions 6 are provided so as to connect the tip ends of the holding portions 5 to each other in locations that differ from the locations where the respective holding portions 5 project from the horn main body 4, an external force that is applied to one of the holding portions 5 (e.g., the holding portion 5A1) is dispersed in each of the respective holding portions 5 (e.g., the holding portions 5A1 and 5A2) that are connected by the connecting portions 6. As a result, deformation of the holding portions 5 is suppressed, and the respective holding portions 5 can be formed extremely thin in the direction parallel to the axial center 4b.

Furthermore, since the horn main body 4, holding portions 5 and connecting portions 6 are integrally formed by being cut from a round bar material that is a single material member, the connection between the holding portions 5 and horn main body 4 is as strong as a metal connection. Accordingly, the holding portions 5 can be made much thinner.

In the shown embodiment, the flat-plate-form holding portions 5 and flat-plate-form thin portions 14 are both formed to extend in the vertical direction (see FIGS. 3 and 4) in the direction of operation (that is in a vertical direction) of the ultrasonic horn 1. Accordingly, the cross-sections of the connection areas between the horn main body 4 and the holding portions 5, and the cross-sections of the connection areas between the holding portions 5 and the thin portions 14, are both long in the vertical direction. Consequently, even in the case of bonding that accompanies a large load, it is unlikely that a plastic deformation, which is caused by the upward and downward movement of the ultrasonic horn 1, occurs in the holding portions 5 or in the thin portions 14. Furthermore, since the cross-sections of the respective connection areas are formed large, the ability to withstand shearing is high.

The holding portions 5 can be, in addition to the above-described flat-plate-form, in a board form of an arc shape or a spherical shape having the center at the center of the ultrasonic vibrator 40.

Incidentally, the vibrational characteristics of the ultrasonic horn 1, and especially the characteristic vibrational frequency and the vibration period that is the reciprocal of this frequency, are not always the same for individual ultrasonic horns. It appears that there is some slight variation depending on the working precision, etc. of the ultrasonic horns 1. In this regard, in the present invention, the holding portions 5A1 and 5B1 are disposed at point p1, which is the first node position from the base end of the horn main body 4, and the holding portions 5A2 and 5B2 are disposed at point p2, which is the second node position. Accordingly, even in a case where the actual nodes of vibration of the ultrasonic horn 1 are located at points p1a and p2a (see FIG. 1), which are shifted from the designed positions, the forces acting on the base end and tip end of the respective holding portions 5 have mutually opposite phases. For instance, the amplitude applied to the holding portions 5A1 and 5B1 which are on the base end side of the ultrasonic horn 1 is positive, and the amplitude applied to the holding portions 5A2 and 5B2 which are on the tip end side is negative. Furthermore, the base end side holding portions 5A1 and the tip end side holding portions 5A2 are connected to each other by the connecting portion 6A, and the base end side holding portions 5B1 and the tip end side holding portions 5B2 are connected to each other by the connecting portion 6B. Accordingly, the forces acting on the base end and tip end of the respective holding portions 5 are cancelled out each other in the connecting portions 6. Thus, a situation, in which the energy that leaks out from the horn main body 4 via the holding portions 5 is transmitted as a vibration to the transducer holder 30 fastened by bolts 35 and connecting portions 6 or to the bonding head driving mechanism, can be avoided.

Furthermore, in addition to the structure in which the positions of two holding portions are set at adjacent nodes as described above, a mutual cancellation of vibrational energies can be obtained also by a different structure in which one holding portion 5 is disposed at an n-th node (n is a natural number) position from the base end of the horn main body 4 and the other holding portion 5 is disposed at an n+m-th node (m is an odd number) position from the base end of the horn main body 4. For instance, two holding portions 5A1 and 5B1 can be disposed at the first node p1 and other two holding portions 5A2 and 5B2 at the fourth node p4, or they can be at the third node p3 and fourth node p4, respectively.

Furthermore, the holding portions 5 that are at a first position from the base end of the horn main body 4 can be disposed at some other desired node position instead of the first node position. However, in order to effectively reduce the leakage of vibrational energy to the holding portions 5 that accompanies the variation in the above-described vibrational characteristics, it is most desirable that the first holding portions 5 from the base end of the horn main body 4 be disposed at the first node p1, which is the closest node position to the ultrasonic vibrator 40.

In the transducer described above, two screw holes 7 that are the fastening means are disposed at different positions in the direction of length of the connecting portions 6. Accordingly, oscillation in the direction of operation of the ultrasonic horn 1 (that corresponds to the vertical direction D of FIG. 3) is effectively prevented. Moreover, the number of points where fastening is made via screw holes 7 can be three or more (instead of two points), and the same effect can be expected in such structures. Furthermore, some other fastening means besides screws may also be used. In the structure described above, the screw holes 7 and bolts 35 are employed, and the bolts 35 are screwed in toward the axial center 4b of the ultrasonic horn 1. With this structure, a high dimensional precision with respect to the vibration is maintained compared to cases where the bolts are screwed in some other direction.

Furthermore, in the shown embodiment, the screw holes 7 are disposed at positions that are equal to each other in terms of the length of the vibration transmission paths that are formed by the holding portions 5 and connecting portions 6 (in concrete terms, such a "length" is the distance from the connection areas between the holding portions 5 and the horn main body 4 to the axial centers of the screw holes 7 in the paths that run along the holding portions 5 and connecting portions 6). Accordingly, the forces that act on the respective holding portions 5 from the horn main body 4 are caused to have mutually opposite phases at the positions of the screw holes 7.

In the shown embodiment, further, the holding portions 5 and connecting portions 6 are disposed on both sides of the axial center 4b of the horn main body 4 so that these elements are symmetrical with respect to this axial center 4b (FIGS. 1 and 3). Accordingly, for two holding portions 5 that are symmetrically disposed on both sides of a certain node (for instance, for the holding portions 5A1 and 5B1), the forces caused by the leakage of vibration are in the same phase and mutually opposite directions. Thus, when both of these holding portions 5 are integrally fastened to a bonding head driving mechanism via the transducer holder 30, the leaking energies are mutually cancelled in the transducer holder 30, and the transmission of vibration to the bonding head driving mechanism is prevented.

Furthermore, in the shown embodiment, the holding portions 5 and connecting portions 6 are disposed in a direction (horizontal direction) that crosses the direction of operation of the ultrasonic horn 1 (vertical direction). Accordingly, by utilizing the connecting portions 6 to fasten the ultrasonic horn 1 to the transducer holder 30 or to a bonding head driving mechanism, it is possible to decrease the dimension in the direction of operation of the ultrasonic horn 1 and especially to increase the clearance on the underside of the ultrasonic horn 1 when the direction of operation is oriented downward. As a result, interference with the semiconductor device that constitutes the object of treatment or with device conveying rails, etc. can be avoided.

In the shown embodiment, the thin portions 14 are formed at the front and rear ends of the connecting portions 6. Accordingly, the transmission of the vibrational energy that leaks out from the holding portions 5 to the connecting portions 6 is buffered by the elastic deformation of the thin portions 14. In addition, since the thin portions 14 are formed as flat plates when viewed from above (see FIG. 1), the cross-sectional secondary moment of the thin portions 14 is extremely small, and the thin plate portions 14 easily undergo elastic deformation, thus being suitable for buffering the vibrational energy.

The ultrasonic horn 1 is manufactured with the holding portions 5 and connecting portions 6 provided therein by way of forming through-holes 20 in a round bar material used as a matrix material for the horn main body 4. Accordingly, working is facilitated in cases where cutting, casting, forging and other working are executed. In the present invention, two through-holes 20 are bored in the same direction (i.e., the vertical direction). Accordingly, such two through-holes 20 are formed in the same direction, and boring by cutting and mold release in the case of casting or forging is efficiently performed. Moreover, the working of the through-holes 20 is accomplished using a tool that is smaller than that used in the working of the flange 54 in the conventional horn. Accordingly, the ultrasonic horn 1 of the present invention is greatly reduced in size as a whole.

Furthermore, in the shown embodiment, the portions of the respective holding portions 5 that are connected by the connecting portions 6 are the tip ends of the respective protruded holding portions 5. In the present invention, however, the portions of the respective holding portions 5 that are connected by the connecting portions 6 are not limited to such tip ends of the protruded holding portions 5. The substantially same effect can be obtained as long as the portions that are connected are located at positions that differ from the areas where the respective holding portions are connected to (or protrude from) the horn main body 4. In addition, in the shown embodiment, the holding portions 5 are provided at two locations on each side with respect to the axial center 4b of the horn main body 4. However, the holding portions 5 can be provided in three or more locations on each side of the horn main body 4. The holding portions 5 and connecting portions 6 can be provided in an asymmetrical fashion in the left-right direction with respect to the horn main body 4.

Next, the second embodiment of the present invention will be described. In this second embodiment, the description of the present invention will be made with reference to transducer used in a flip-chip bonding apparatus.

Figure 6:
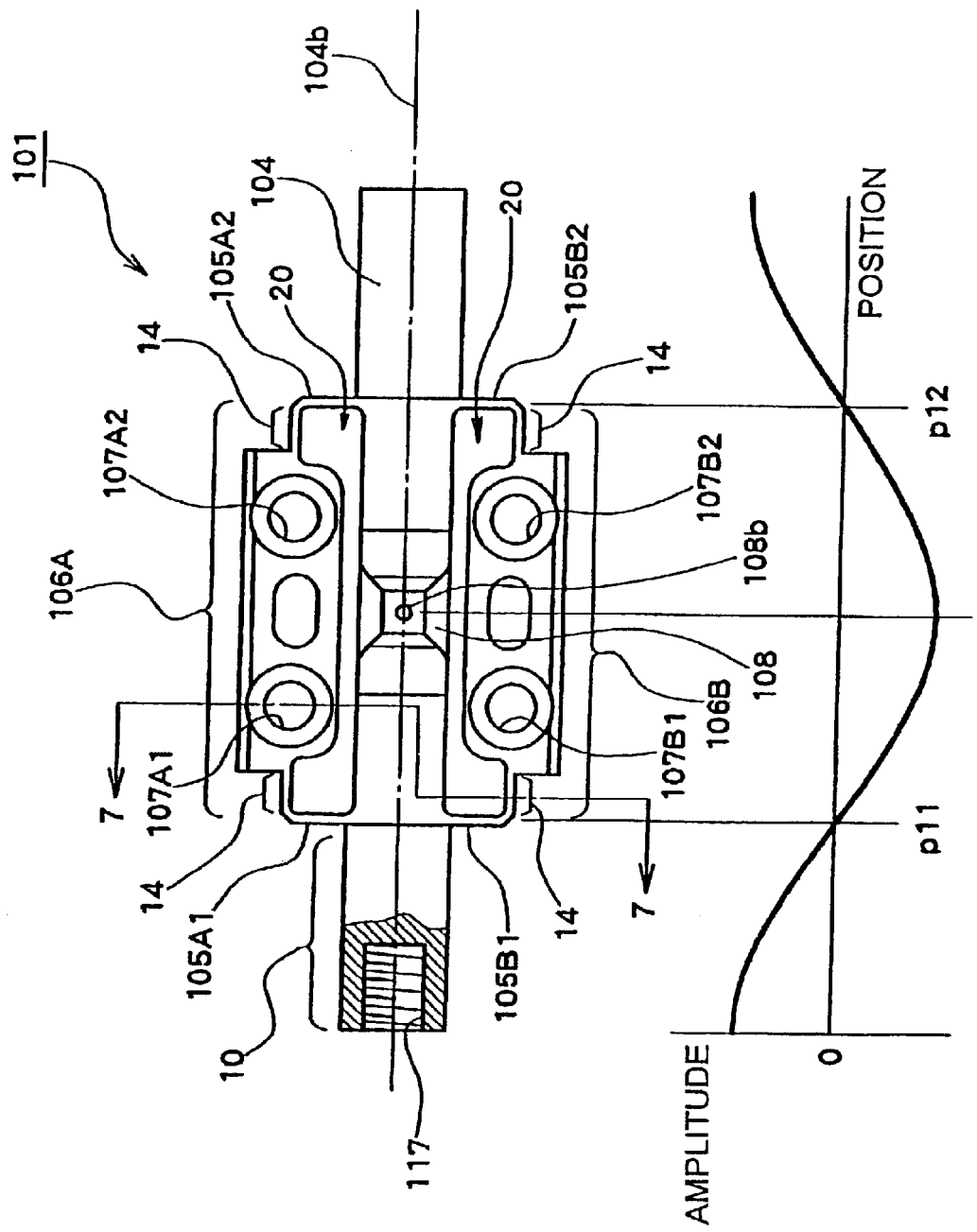
FIG. 6 is a top view of the transducer used as a bonding horn according to the second embodiment of the present invention, a graph indicating the positions of the nodes of vibration being shown with reference to the transducer.
Figure 7:
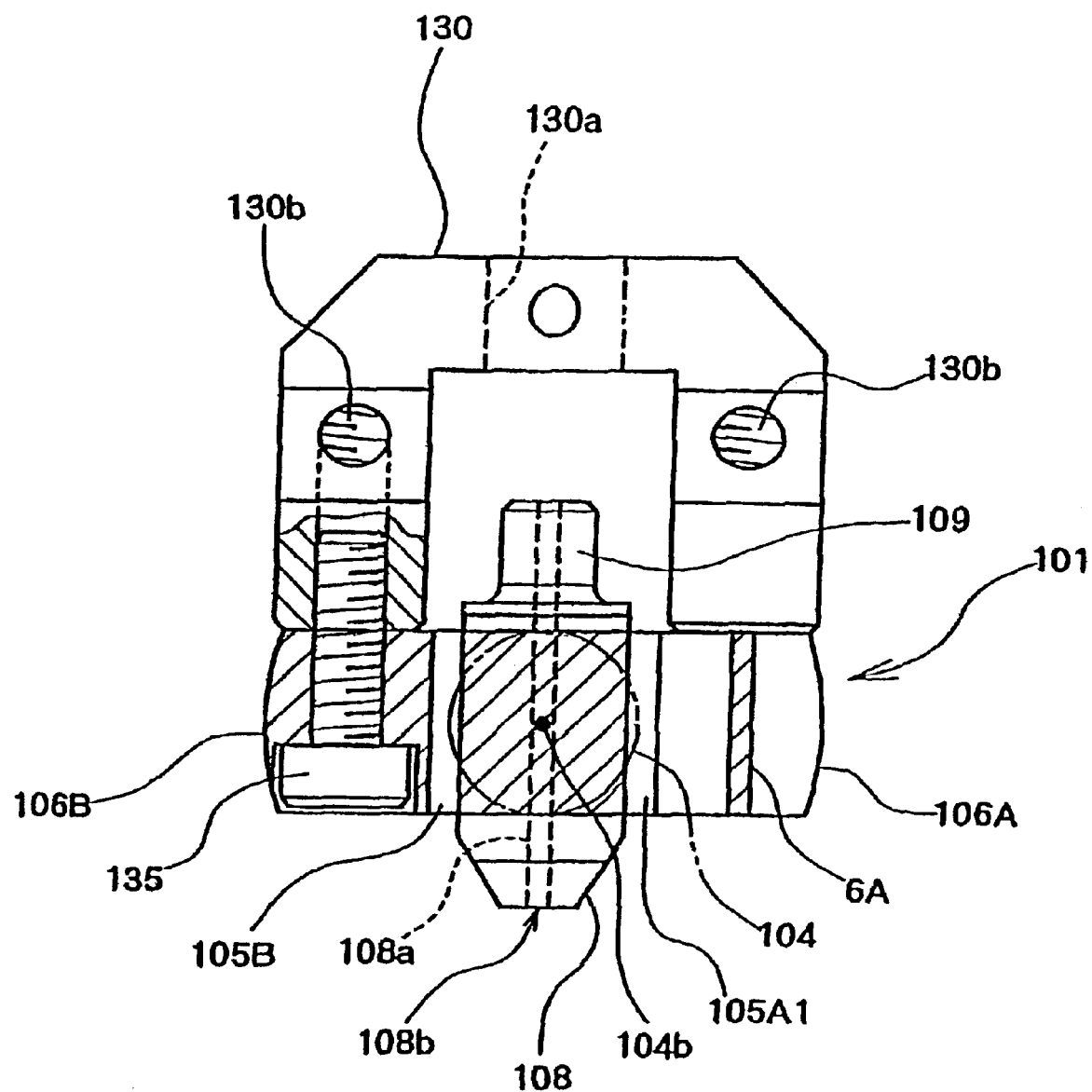
FIG. 7 is an enlarged sectional view of the transducer mounted to a transducer holder, the transducer being taken along the line 7—7 in FIG. 6.

As shown in FIGS. 6 and 7, the ultrasonic horn 101 used as a transducer includes, instead of the corn portion 4a, mounting hole 8 and connecting portion 6 of the first embodiment, a horn main body 104, a suction-chucking nozzle 108, tube connecting port 109 and connecting portions 106A and 106B (collectively referred to as "connecting portions 106"). The suction-chucking nozzle 108, tube connecting port 109 and connecting portions 106 are all integrally formed from the same member as the horn main body 104 (e.g., by cutting from a round bar material similar to that used in the first embodiment).

The suction-chucking nozzle 108 has a square pyramid shape, and the tube connecting port 109 (see FIG. 7) has a cylindrical shape. A through-hole 108a oriented in the vertical direction is formed through the centers of the suction-chucking nozzle 108 and the tube connecting port 109, and the lower end portion of the through-hole 108a constitutes a chip suction-chucking port 108b.

Among the four holding portions 105A1, 105A2, 105B1 and 105B2 (collectively referred to as "holding portions 105"), the holding portions 105A1 and 105B1 which are on the rear side of the horn main body 104 are disposed in the position of the first node p11 from the base end of the horn main body 104, and the holding portions 105A2 and 105B2 on the front side of the horn main body 104 are disposed in the position of the second node p12 from the base end of the horn main body 104.

Meanwhile, as seen from FIG. 6, the chip suction-chucking port 108b is disposed at an intermediate point between the two sets of holding portions 105 (one set comprising the holding portions 105A1 and 105B1 and the other comprising the holding portions 105A2 and 105B2), so that the center of this chip suction-chucking port 108b coincides with a vibration crest (an area where the absolute value of the velocity is a maximum value). In other words, the chip suction-chucking port 108b is provided at an intermediate portion between the installation points of the holding portions 105A1 and 105B1 and the installation points of the holding portions 105A2 and 105B2.

The holding portions 105 are designed so that the intermediate points of the holding portions in the direction of thickness thereof accurately coincide with the vibration nodes p11 and p12 in the design of the ultrasonic horn 101. However, since there is a certain variation in the actual positions of the nodes of vibration of the ultrasonic horn 011 depending upon the manufacturing precision of the ultrasonic horn 101, the actual positions of the nodes of vibration may differ from the designed positions in some cases. The thickness of the respective holding portions 105 is approximately 0.5 mm.

Through-holes 107A1, 107A2, 107B1 and 107B2 (collectively referred to as "through-holes 107") oriented in the vertical direction, which are to be screw-engaged with bolts 135, are formed in the connecting portions 106, so that the through-holes 107A1 and 107A2 are in the connecting portion 106A, and the through-holes 107B1 and 107B2 are in the 106B.

Figure 8:
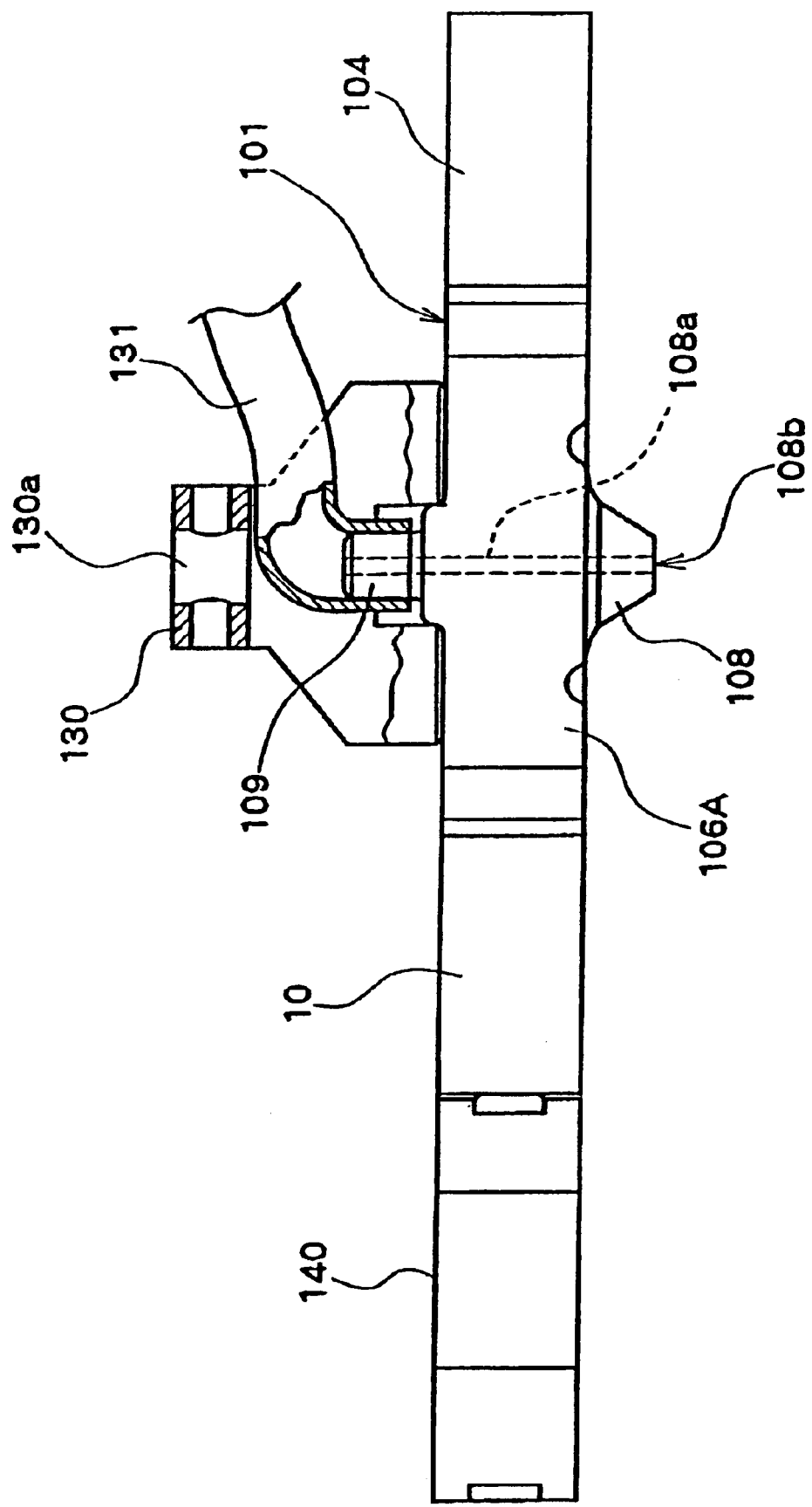
FIG. 8 is a schematic side view of the transducer mounted in to the transducer holder.
Figure 9:
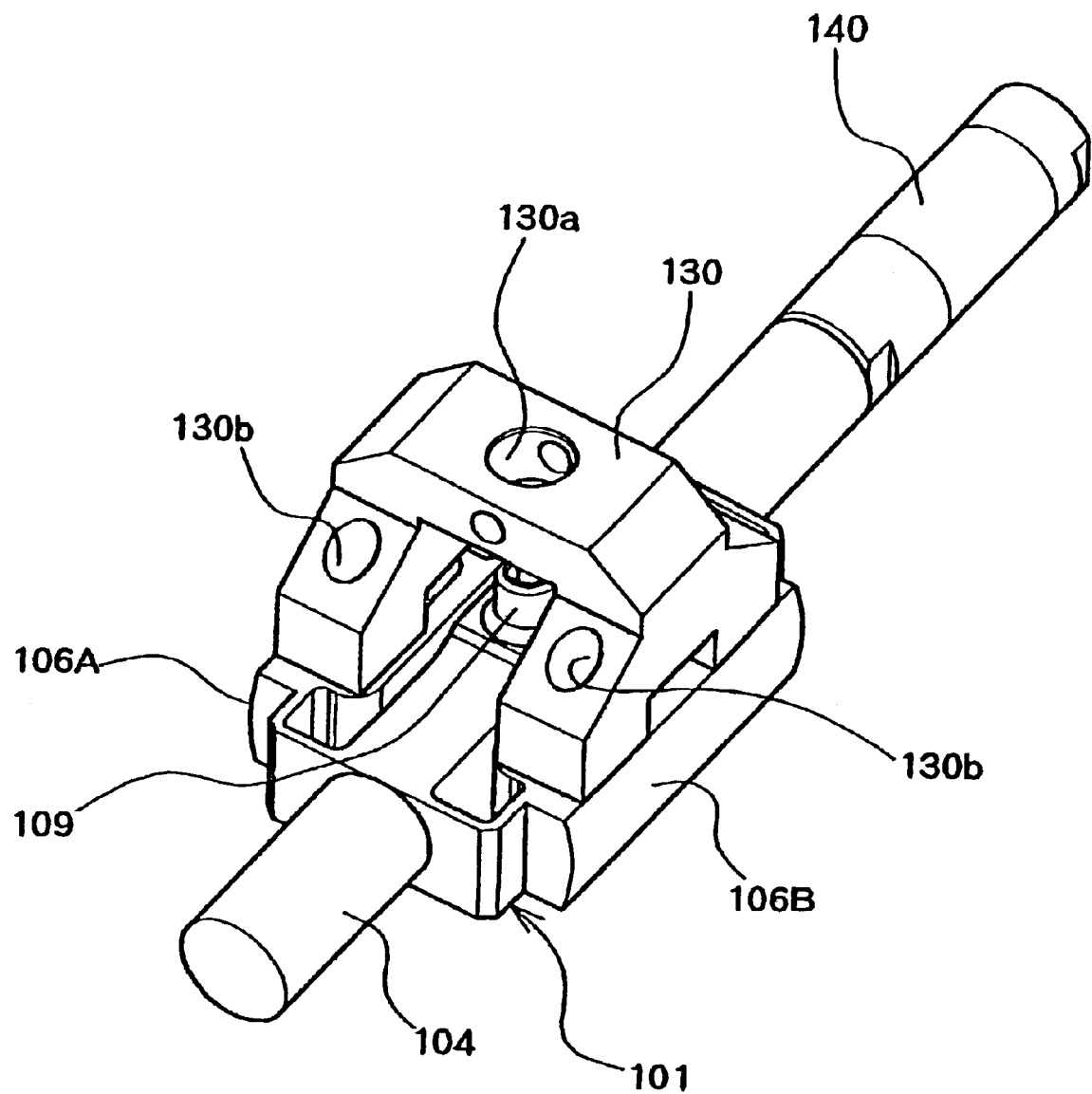
FIG. 9 is a schematic perspective view of the transducer mounted to the transducer holder.
Figure 10:
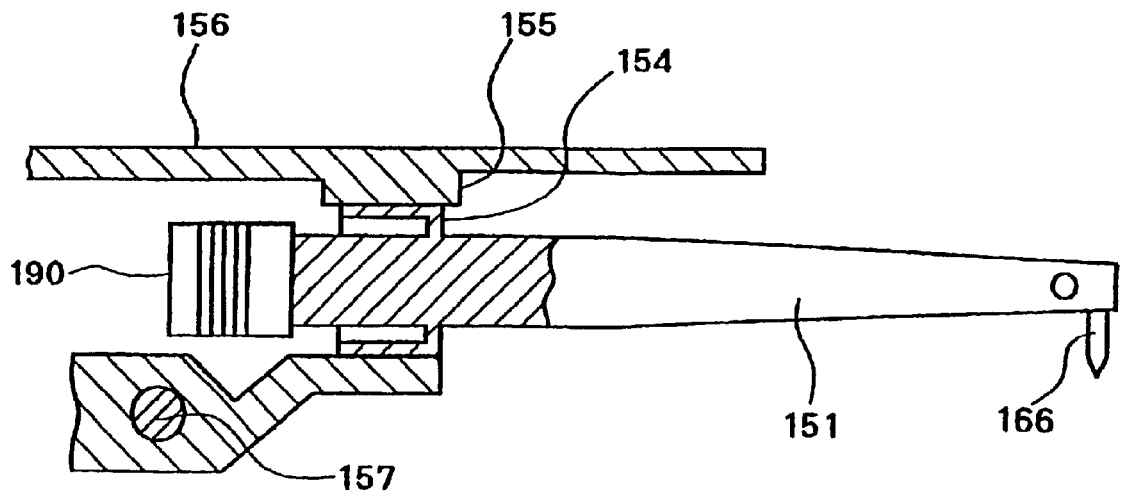
FIG. 10 is a side view of an attachment structure of a conventional transducer (ultrasonic horn)
Figure 11:
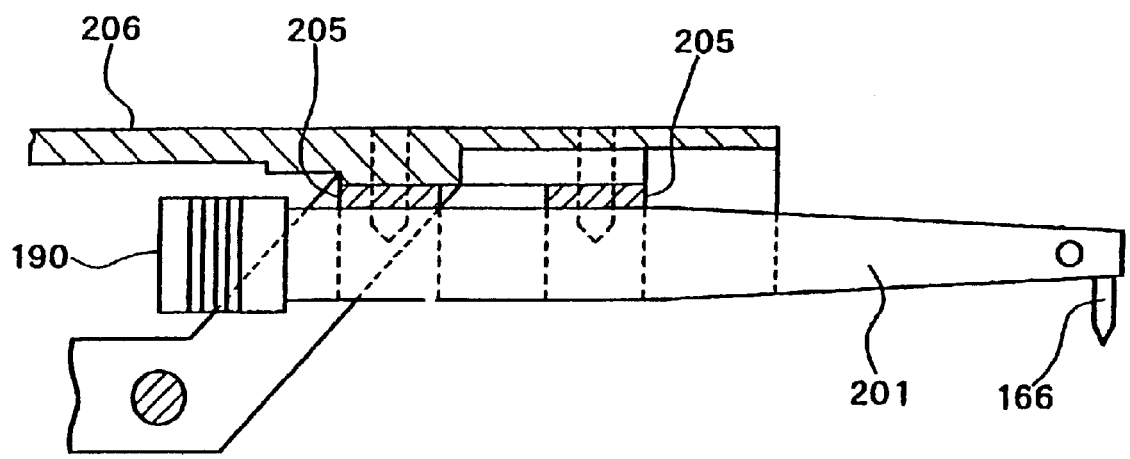
FIG. 11 is a side view of an attachment structure of another conventional transducer (ultrasonic horn)

As shown in FIGS. 7 through 9, the ultrasonic horn (transducer) 101 is fastened to a transducer holder 130 during use. The transducer holder 130 has substantially a U-shape structure that can connect the left and right connecting portions 106 with the tube connecting port 109 in between in a bridging fashion. A mounting hole 130a which is used to mount the transducer holder 130 on the bonding head driving mechanism of a wire bonder main body (not shown) is formed in the top section of the transducer holder 130. The center of the mounting hole 130a is positioned so as to be directly above the axial center 104b of the horn main body 104. Vertically oriented screw holes 130b, which are disposed so as to correspond to the four through-holes 107A1, 107A2, 107B1 and 107B2 and are screw-engaged with the bolts 135, are respectively formed in the transducer holder 130.

A known ultrasonic vibrator 140 (see FIGS. 8 and 9) which is formed by stacked electrostriction elements in the axial direction is fastened to a screw hole 117 (see FIG. 6) formed in the base end portion of the horn main body 104. Furthermore, a flexible tube 131 (see FIG. 8) made of rubber is connected to the tube connecting port 109.

The remaining structure of the second embodiment is substantially the same as that of the first embodiment. The same reference numerals are assigned, and a description is omitted.

In the second embodiment described above, the ultrasonic horn 101 suction-chucks a semiconductor device (not shown) at the chip suction-chucking port 108b by means of suction transmitted via the flexible tube 131 and through-hole 108a, and it conveys this semiconductor device to a bonding position. Then, in this state, the ultrasonic horn 101 is driven downward by the bonding head driving mechanism. The ultrasonic vibrations generated by the ultrasonic vibrator 140 are transmitted as a compression wave (longitudinal wave) along the direction of length of the ultrasonic horn 101, i.e. from the base end toward the tip end along the axial center 104b, and bonding is accomplished by the ultrasonic vibrations and by the load applied by the bonding head driving mechanism.

In the second embodiment, in addition to the respective effects described above which are similar to those in the first embodiment, since the chip suction-chucking port 108b is disposed at an intermediate portion between the installation points of the holding portions 105A1 and 105B1 and the installation points of the holding portions 105A2 and 105B2, the load distribution on the chip suction-chucking port 108b, and therefore the load distribution on the semiconductor device, can be evened out in the direction of length of the ultrasonic horn 101.

Furthermore, in the second embodiment, the ultrasonic vibrator 140 is installed in the base end portion of the horn main body 104, while nothing is installed in the tip end portion of the horn main body 104. However, by way of taking a structure in which a counterweight which has a mass equal to that of the ultrasonic vibrator 140 is provided at the tip end portion of the horn main body 104, the ultrasonic horn 101 as a whole can be balanced in terms of weight, and a much more uniform load distribution can be obtained.

The embodiments above are described with reference to a wire bonding apparatus and a flip-chip bonding apparatus. However, the present invention is not limited to such bonding apparatuses. The present invention is applicable to various types of apparatuses that perform a processing action with a use of vibration of a transducer, such as a die bonding apparatus, etc. All of these applications are within the scope of the present invention. Furthermore, the shape of the transducer is likewise not limited to one shown in the above embodiments, and various types of shapes can be selected in accordance with the use and purpose of the apparatus.

What is claimed is:

1. A transducer caused to vibrate by an operation of a vibrator, said transducer comprising:

holding portions which are provided in at least two locations that include nodes of vibration on each side of a transducer main body, and connecting portions that connect said holding portions to each other at areas that differ twin areas whore said holding portions protrude from said transducer main body; wherein said transducer main body, said holding portions and said connecting portions are integrally formed from a single material member, and a tool that performs a treatment action is installed in a position that is outside a region between at least two of said holding portions and is located at a vibration crest.

2. A transducer caused to vibrate by an operation of a vibrator, said transducer comprising:

holding portions which are provided in at least two locations that include nodes of vibration on each side of a transducer main body, and connecting portions that connect said holding portions to each other at areas that differ from areas where said holding portions protrude from said transducer main body; wherein said transducer main body, said holding portions and said connecting portions are integrally formed from a single material member, and, a chip suction-chucking port is installed in a position that is inside a region between at least two of said holding portions and is located at a vibration crest.

3. The transducer according to claim 2, wherein said holding portions are provided at two locations, and said chip suction-chucking port is disposed at an intermediate point between points where said holding portions are installed.

4. A bonding apparatus that includes said transducer according to claim 1, 2 or 3.

* * * * *